(12) United States Patent
Chiu (10) Patent No.: US 10,573,623 B2
(45) Date of Patent: Feb. 25, 2020

(54) ELECTRONIC PACKAGE STRUCTURE WITH MULTIPLE ELECTRONIC COMPONENTS

(71) Applicant: Siliconware Precision Industries Co., Ltd., Taichung (TW)

(72) Inventor: Chih-Hsien Chiu, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 15/352,822

(22) Filed: Nov. 16, 2016

(65) Prior Publication Data
US 2018/0061809 A1 Mar. 1, 2018

(30) Foreign Application Priority Data
Aug. 24, 2016 (TW) .............................. 105127017 A (51) Int. Cl.
*H01L 25/065* (2006.01)
*H01L 25/16* (2006.01)
(Continued)

(52) U.S. Cl.
CPC .......... *H01L 25/0657* (2013.01); *H01L 21/56* (2013.01); *H01L 23/3107* (2013.01);
(Continued)

(58) Field of Classification Search
CPC . H01L 21/56; H01L 23/49541; H01L 23/552; H01L 23/3107; H01L 24/81; H01L 24/17; H01L 24/49; H01L 24/33; H01L 25/0657; H01L 2924/181; H01L 2924/11; H01L 2924/19042; H01L 2924/19105; H01L 2924/19106; H01L 2924/19107; H01L 2924/19043; H01L 2924/19041; H01L 2924/15321; H01L 2924/15311;
(Continued)

(56) References Cited

U.S. PATENT DOCUMENTS 7,015,571 B2 * 3/2006 Chang .................. H01L 25/105
 174/266
8,247,893 B2 * 8/2012 Kim ...................... H01L 21/563
 257/686

(Continued)

*Primary Examiner* — Jamie C Niesz
*Assistant Examiner* — Scott E Bauman
(74) *Attorney, Agent, or Firm* — Mintz Levin Cohn Ferris Glovsky and Popeo, P.C.; Peter F. Corless; Steven M. Jensen (57) ABSTRACT

An electronic package structure is provided, which includes: a first carrier having an opening; at least a first electronic component and a plurality of conductive elements disposed on the first carrier; a second carrier bonded to the conductive elements; at least a second electronic component disposed on the second carrier and received in the opening of the first carrier; and an encapsulant formed on the first carrier and the second carrier and encapsulating the first electronic component, the second electronic component and the conductive elements. By receiving the second electronic component in the opening of the first carrier, the present disclosure reduces the height of the electronic package structure. The present disclosure further provides a method for fabricating the electronic package structure.

9 Claims, 6 Drawing Sheets (51) Int. Cl.
  *H01L 25/10* (2006.01)
  *H01L 25/03* (2006.01)
  *H01L 23/495* (2006.01)
  *H01L 21/56* (2006.01)
  *H01L 23/31* (2006.01)
  *H01L 23/552* (2006.01)
  *H01L 23/00* (2006.01)
  *H01L 25/00* (2006.01)

(52) U.S. Cl.
  CPC .. *H01L 23/49531* (2013.01); *H01L 23/49541* (2013.01); *H01L 23/552* (2013.01); *H01L 24/17* (2013.01); *H01L 24/33* (2013.01); *H01L 24/49* (2013.01); *H01L 24/81* (2013.01); *H01L 25/03* (2013.01); *H01L 25/105* (2013.01); *H01L 25/16* (2013.01); *H01L 25/50* (2013.01); *H01L 21/561* (2013.01); *H01L 21/568* (2013.01); *H01L 23/3128* (2013.01); *H01L 2224/0401* (2013.01); *H01L 2224/16227* (2013.01); *H01L 2224/48227* (2013.01); *H01L 2225/06517* (2013.01); *H01L 2225/06572* (2013.01); *H01L 2225/1023* (2013.01); *H01L 2225/1058* (2013.01); *H01L 2924/00014* (2013.01); *H01L 2924/11* (2013.01); *H01L 2924/15151* (2013.01); *H01L 2924/15311* (2013.01); *H01L 2924/15321* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19106* (2013.01); *H01L 2924/19107* (2013.01); *H01L 2924/3025* (2013.01)

(58) Field of Classification Search
  CPC ............. H01L 2924/3025; H01L 25/03; H01L 25/105; H01L 25/16; H01L 25/50; H01L 23/49531; H01L 21/561; H01L 2224/16227; H01L 2224/0401; H01L 2224/48227; H01L 2225/1023; H01L 2225/06572; H01L 2225/1058
  See application file for complete search history.

(56) References Cited

U.S. PATENT DOCUMENTS

| | | | |
|---|---|---|---|
| 8,618,671 B2* | 12/2013 | Kwon | H01L 23/13 257/686 |
| 10,388,637 B2* | 8/2019 | Kim | H01L 23/49838 |
| 2005/0098868 A1* | 5/2005 | Chang | H01L 25/105 257/686 |
| 2006/0007662 A1* | 1/2006 | Vasudivan | H05K 1/0231 361/763 |
| 2006/0245308 A1* | 11/2006 | Macropoulos | H05K 1/024 369/1 |
| 2007/0052082 A1* | 3/2007 | Lee | H01L 25/03 257/686 |
| 2007/0257377 A1* | 11/2007 | Chen | H01L 23/3107 257/786 |
| 2008/0023816 A1* | 1/2008 | Weng | H01L 23/3128 257/690 |
| 2008/0111224 A1* | 5/2008 | Byun | H01L 23/12 257/686 |
| 2009/0020885 A1* | 1/2009 | Onodera | H01L 23/13 257/777 |
| 2012/0063038 A1* | 3/2012 | Yin | H05K 9/0007 361/18 |

* cited by examiner

ELECTRONIC PACKAGE STRUCTURE WITH MULTIPLE ELECTRONIC COMPONENTS

CROSS-REFERENCE TO RELATED APPLICATION

This application claims under 35 U.S.C. § 119(a) the benefit of Taiwanese Patent Application No. 105127017 filed Aug. 24, 2016, the entire contents of which are incorporated herein by reference.

BACKGROUND

1. Technical Field

The present disclosure relates to package structures, and, more particularly, to a stack-type electronic package structure and a method of fabricating the same.

2. Description of Related Art

Along with the rapid development of portable electronic products, modern products have been developed toward the trend of high density, high performance and miniaturization. Accordingly, various package on package (PoP) technologies are developed in semiconductor packaging industries to meet the requirements of high density and miniaturization.

Figure 1:
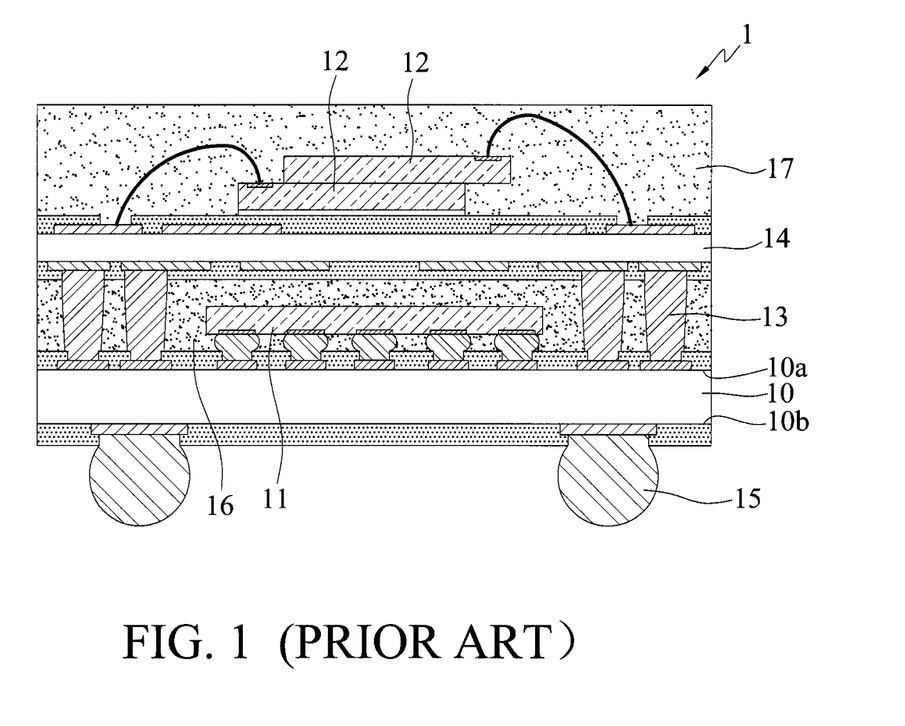
FIG. 1 is a schematic cross-sectional view of a conventional PoP structure.

FIG. 1 is a schematic cross-sectional view of a conventional PoP structure 1. Referring to FIG. 1, the PoP structure 1 has: a first substrate 10 having a first surface 10a and a second surface 10b opposite to the first surface 10a; a first semiconductor chip 11 disposed on the first surface 10a of the first substrate 10; a plurality of solder posts 13 disposed on the first surface 10a of the first substrate 10; a first encapsulant 16 formed on the first surface 10a of the first substrate 10 to encapsulate the first semiconductor chip 11 and the solder posts 13; a plurality of solder balls 15 formed on the second surface 10b of the first substrate 10; a second substrate 14 stacked on the first substrate 10 through the solder posts 13; a plurality of second semiconductor chips 12 wire-bonded to the second substrate 14; and a second encapsulant 17 formed on the second substrate 14 to encapsulate the second semiconductor chips 12.

Generally, there is no more space available for passive components to be added to the PoP structure 1, and the electrical performance of the PoP structure 1 cannot be further optimized Besides, passive components are generally higher than the first semiconductor chip 11 and the second semiconductor chips 12. As such, if a passive component is added, the height of the PoP structure 1 will be greatly increased. For example, if the passive component is disposed on the first substrate 10, the height of the solder posts 13 will be increased; otherwise, if the passive component is disposed on the second substrate 14, the height of the second encapsulant 17 will be increased. Consequently, the PoP structure 1 cannot meet the miniaturization requirement.

Therefore, there is a need to provide an electronic package structure and a fabrication method thereof so as to overcome the above-described drawbacks.

SUMMARY

In view of the above-described drawbacks, the present disclosure provides an electronic package structure, which comprises: a first carrier having an opening; at least a first electronic component disposed on and electrically connected to the first carrier; a plurality of conductive elements disposed on and electrically connected to the first carrier; a second carrier bonded to the conductive elements and electrically connected to the first carrier; at least a second electronic component disposed on the second carrier and received in the opening of the first carrier; and a first encapsulant formed on the second carrier and encapsulating the second electronic component and the conductive elements.

The present disclosure further provides a method for fabricating an electronic package structure, which comprises: providing a first carrier having an opening with at least a first electronic component disposed on and electrically connected to the first carrier; bonding and electrically connecting the first carrier to a second carrier through a plurality of conductive elements with at least a second electronic component disposed on the second carrier and received in the opening of the first carrier; and forming on the second carrier a first encapsulant encapsulating the second electronic component and the conductive elements.

In an embodiment, the first encapsulant is further formed on the first carrier and encapsulates the first electronic component.

In an embodiment, the opening is positioned within an edge of the first carrier.

In an embodiment, the opening is positioned on a side of the first carrier.

In an embodiment, the opening is positioned on a corner of the first carrier.

In an embodiment, at least one of the first electronic component and the second electronic component is a package, an active component, or a passive component.

In an embodiment, the conductive elements are solder balls, copper core balls, metal elements, circuit boards, or any combination thereof.

In an embodiment, at least one of the first carrier and the second carrier is a circuit structure, a lead frame, a wafer, or a carrier board with a metal layout.

In an embodiment, the first electronic component is positioned between the first carrier and the second carrier.

In an embodiment, the second electronic component is electrically connected to the first carrier, the second carrier or both the first and second carriers.

In an embodiment, the second electronic component is electrically connected to the first carrier through a conductor.

In an embodiment, the second carrier has at least a board served as an EMI shield.

In an embodiment, before formation of the encapsulant, a second encapsulant is formed and encapsulates the first electronic component.

Therefore, by receiving the second electronic component such as a passive component in the opening of the first carrier, the present disclosure reduces the height of the electronic package structure so as to meet the miniaturization requirement.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

Figure 2A:
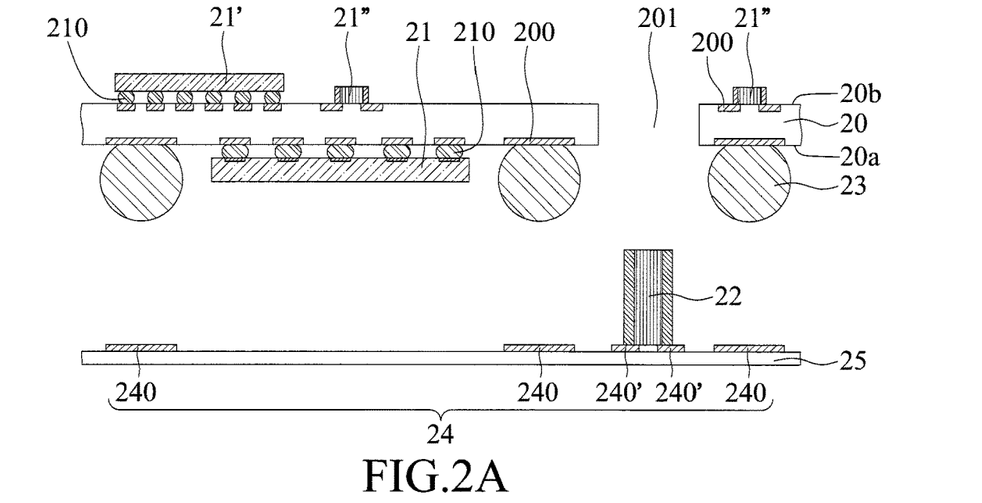
FIGS. 2A to 2C are schematic cross-sectional views showing a method for fabricating an electronic package structure according to a first embodiment of the present disclosure, wherein FIG. 2B' shows another embodiment of FIG. 2B, and FIGS. 2C' and 2C" show other embodiments of FIG. 2C.
Figure 2B:
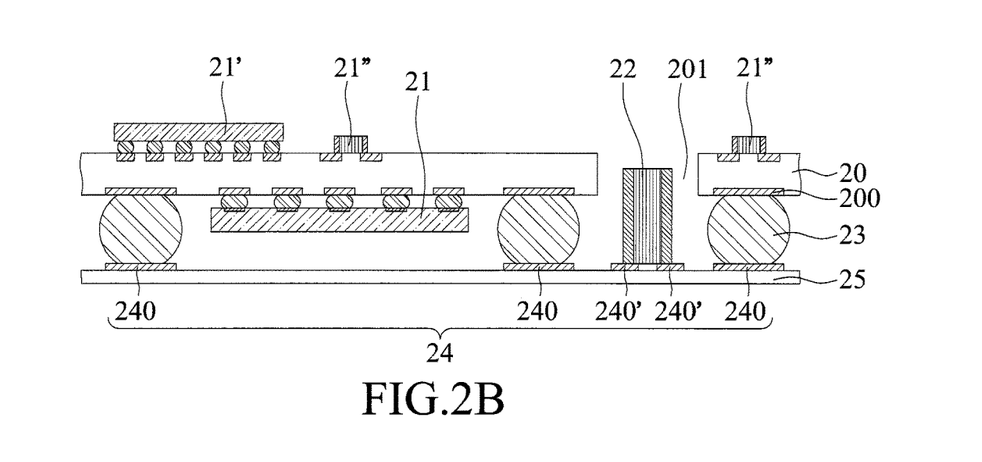
Figure 2C:
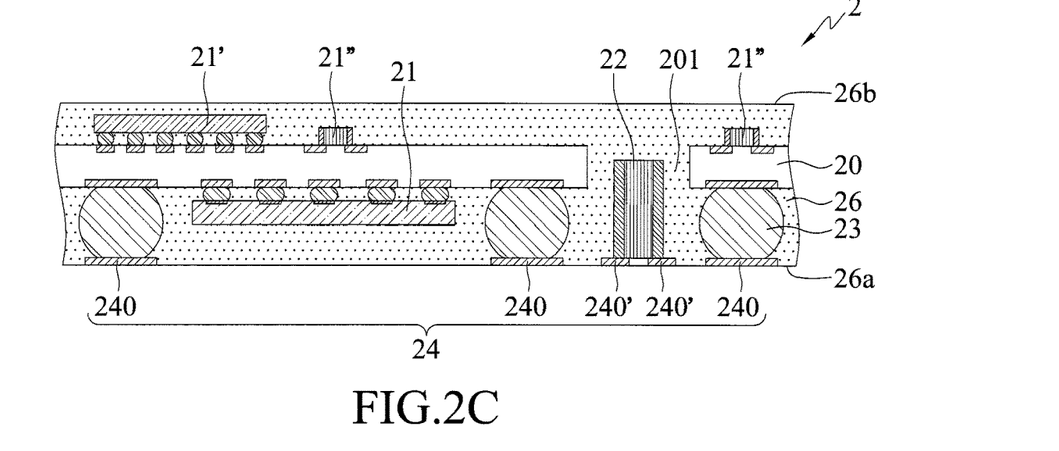

FIGS. 2A to 2C are schematic cross-sectional views showing a method for fabricating an electronic package structure 2 according to a first embodiment of the present disclosure.

Referring to FIG. 2A, a first carrier 20 is provided. The first carrier 20 has a first side 20a, a second side 20b opposite to the first side 20a, and at least an opening 201 communicating the first side 20a and the second side 20b. At least a first electronic component 21 and a plurality of conductive elements 23 such as solder balls are disposed on the first side 20a of the first carrier 20, and a plurality of first electronic components 21', 21" are disposed on the second side 20b of the first carrier 20.

In an embodiment, the first carrier 20 is a core circuit structure such as a packaging substrate, or a coreless circuit structure, and has a plurality of circuit layers 200 such as fan-out redistribution layers. In another embodiment, the first carrier 20 is a lead frame, a wafer, or a carrier board with a metal layout (for example, low temperature cofired ceramic (LTCC) or ferrite).

Figure 3A:
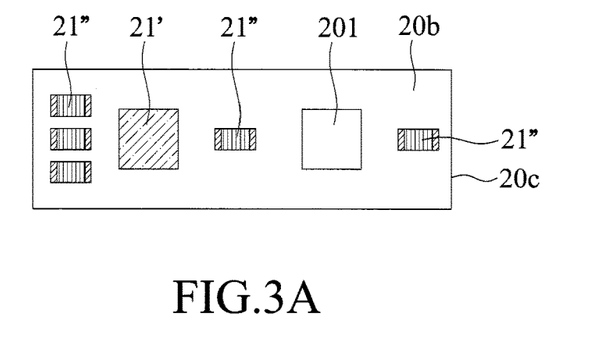
FIGS. 3A to 3D are schematic upper views showing various aspects of a first carrier of FIG. 2A.
Figure 3B:
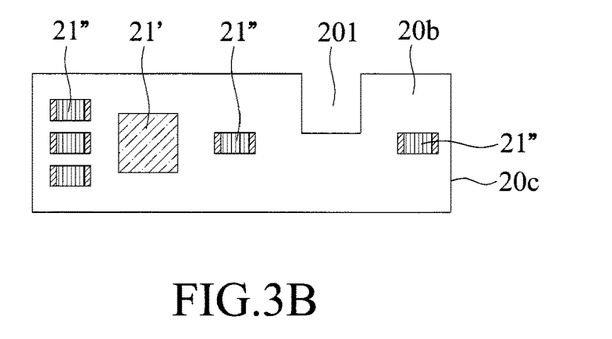
Figure 3C:
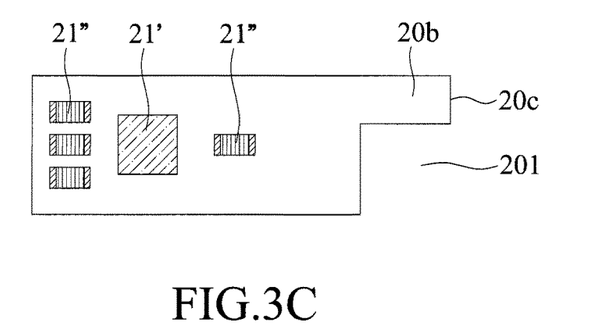
Figure 3D:
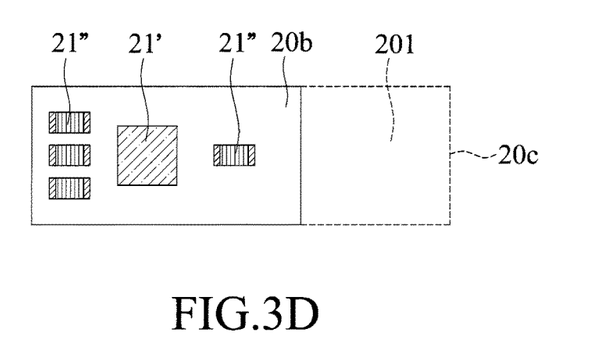

The number of the opening 201 can be one or more, and the position thereof can be determined according to the practical need and varied corresponding to the arrangement of the circuit layers 200. In an embodiment, the opening 201 can be positioned at a center, a periphery or a corner of the first carrier 20 so as to increase the area utilization of the first carrier 20. FIGS. 3A to 3D are schematic upper views showing various aspects of the first carrier 20. Referring to FIG. 3A, the opening 201 is completely positioned within an edge 20c of the first carrier 20. Referring to FIG. 3B, one side of the opening 201 communicates with an edge 20c of the first carrier 20, i.e., a side of the first carrier 20. Referring to FIG. 3C, two sides of the opening 201 communicate with an edge 20c of the first carrier 20, that is, the opening 201 is positioned on a corner of the first carrier 20. Referring to FIG. 3D, three sides of the opening 201 communicate with an edge 20c of the first carrier 20, that is, a side portion of the first carrier 20 is removed.

In an embodiment, at least one of the first electronic components 21, 21', 21" is a package such as a chip scale package, an active component such as a semiconductor chip, a passive component, such as a resistor, a capacitor or an inductor, or a combination thereof. In an embodiment, the first electronic component 21 is an active component, the first electronic component 21' is a package, and the first electronic component 21" is a passive component. In an embodiment, the first electronic components 21, 21' are disposed in a flip-chip manner on and electrically connected to the circuit layers 200 through a plurality of conductive bumps 210. In an embodiment, the conductive bumps 210 are made of such as a solder material. In another embodiment, the first electronic components 21, 21' are electrically connected to the circuit layers 200 through bonding wires (not shown). In another embodiment, the first electronic component 21" is in direct contact with the circuit layers 200.

A second carrier 24 having at least a second electronic component 22 disposed thereon is provided. In an embodiment, the second carrier 24 is a lead frame having a plurality of conductive pads 240, 240' that are separated from one another. The second electronic component 22 is bonded to the conductive pads 240' so as to be electrically connected to the second carrier 24. In another embodiment, the second carrier 24 is a carrier carrying chips. In an embodiment, the second carrier 24 is a core circuit structure, a coreless circuit structure, a wafer, or a carrier board with a metal layout (such as LTCC or ferrite).

The second carrier 24 is optionally disposed on a supporting member 25 such as a tape. In an embodiment, the second electronic component 22 is a package such as a chip scale package, an active component such as a semiconductor chip, a passive component, such as a resistor, a capacitor or an inductor, or a combination thereof. In an embodiment, the second electronic component 22 is a passive component.

Referring to FIG. 2B, the first carrier 20 is bonded to the conductive pads 240 of the second carrier 24 through the conductive elements 23. As such, the circuit layers 200 of the first carrier 20 are electrically connected to the second carrier 24 and the second electronic component 22 is received in the opening 201 of the first carrier 20.

In another embodiment, referring to FIG. 2B', the first carrier 20 is stacked on the second carrier 24 first and then the second electronic component 22 is disposed on the conductive pads 240' of the second carrier 24 and received in the opening 201 of the first carrier 20.

Referring to FIG. 2C, a first encapsulant 26 is formed on the first carrier 20 and the second carrier 24 (or the supporting member 25) and filled in the opening 201 so as to encapsulate the first electronic components 21, 21', 21", the second electronic component 22 and the conductive elements 23. Thereafter, the supporting member 25 is removed.

In an embodiment, the first encapsulant 26 is made of polyimide, a dry film, an epoxy resin, or a molding compound. The first encapsulant 26 has a first surface 26a and a second surface 26b opposite to the first surface 26a. The second carrier 24 is embedded in the first surface 26a of the first encapsulant 26, and the conductive pads 240 are exposed from the first surface 26a of the first encapsulant 26. In an embodiment, surfaces of the conductive pads 240 are flush with the first surface 26a of the first encapsulant 26. As such, a solder material such as solder balls (not shown) can further be formed on the exposed surfaces of the conductive pads 240 for bonding with an electronic device such as a circuit board.

Further, referring to FIG. 2C', the conductive elements 23' can be ring-shaped circuit boards or strip-shaped circuit boards that are bonded to the circuit layers 200 and the conductive pads 240 through a solder material 23a, thus increasing the gap between the first carrier 20 and the second carrier 24 and providing sufficient space between the first and second carriers 20, 24 for receiving the first electronic component 21. In another embodiment, referring to FIG.

2C''', the conductive elements 23'' are copper core balls or (post-shaped, block-shaped or pin-shaped) metal elements of copper or gold.

Figure 5A:
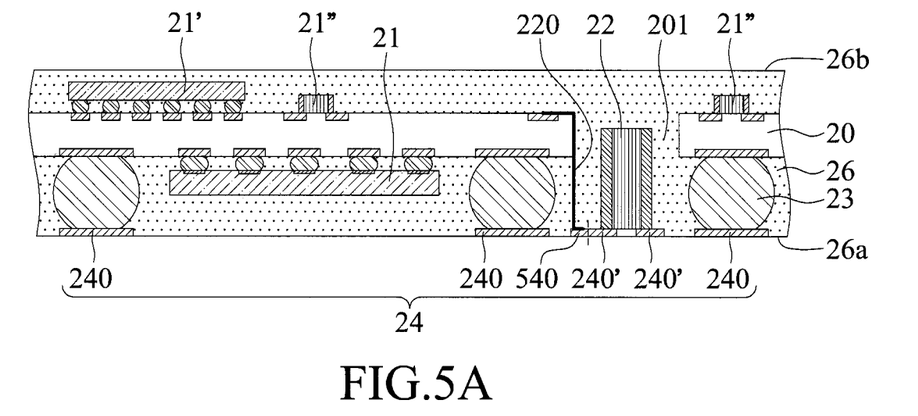
FIGS. 5A and 5B are schematic cross-sectional views showing various aspects of FIG. 2C'.
Figure 5B:
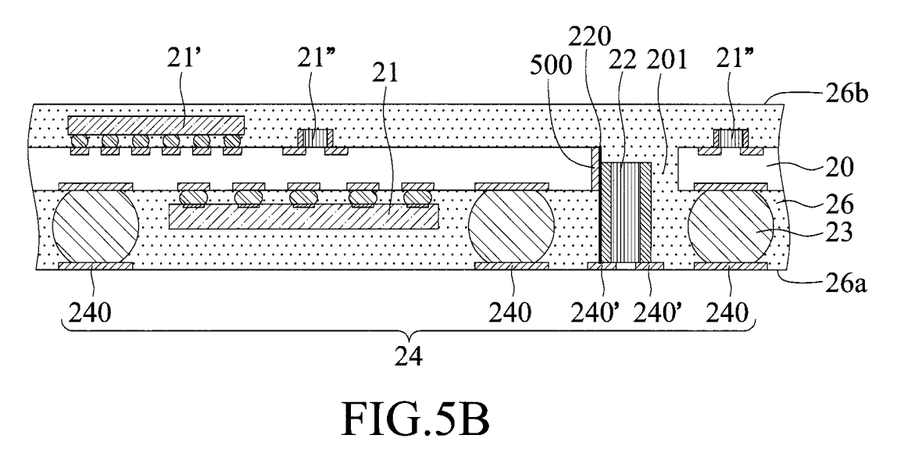

Again referring to FIG. 2C', the second electronic component 22 is electrically connected to the circuit layers 200 of the first carrier 20 of the first carrier 20 through conductors 220 such as bonding wires or clip bars. In another embodiment, referring to FIG. 5A, the conductors 220 electrically connect the circuit layers 200 of the first carrier 20 and circuits 540 of the second carrier 24. The circuits 540 are electrically connected to the conductive pads 240'. In a further embodiment, referring to FIG. 5B, the conductors 220 electrically connect side circuits 500 of the first carrier 20 and the second electronic component 22. In an embodiment, the conductors 220 are made of a conductive adhesive or a solder material.

Again referring to FIG. 2C''', the second carrier 24' further has at least a board 241 that can be separated from or connected to the conductive pads 240, 240' and grounded to provide an electromagnetic interference (EMI) shielding effect.

Therefore, since the second electronic component 22 (such as a passive component) disposed on the second carrier 24 is received in the opening 201 of the first carrier 20, the present disclosure reduces the height of the electronic package structure 2 and meets the miniaturization requirement.

Further, the second carrier 24' provides an EMI shielding effect. In addition, if the second carrier 24, 24' is a lead frame or a metal board, the heat dissipating efficiency of the electronic package structure 2 is improved.

Conventionally, active components and passive components are disposed on the same substrate and electrically connected through circuits of the substrate. By contrast, according to the present disclosure the second electronic component 22 (passive component) and the first electronic component 21 (active component) of the electronic package structure 2 are disposed on different carriers and cannot be directly electrically connected through circuits of the same carrier. Through the design of the conductors 220, the present disclosure reduces the wiring area of the first carrier 20 and the second carrier 24 (for example, the I/O count) and reduces AC and DC impedances. Referring to FIG. 2C, if the first electronic component 21 is electrically through the conductive elements 23, the conductive pads 240, and circuits (not shown) of the second carrier 24 to the conductive pads 240' and the second electronic component 22, the circuits between the conductive pads 240, 240' will be longer than the circuits 540 of FIG. 5A.

Figure 4:
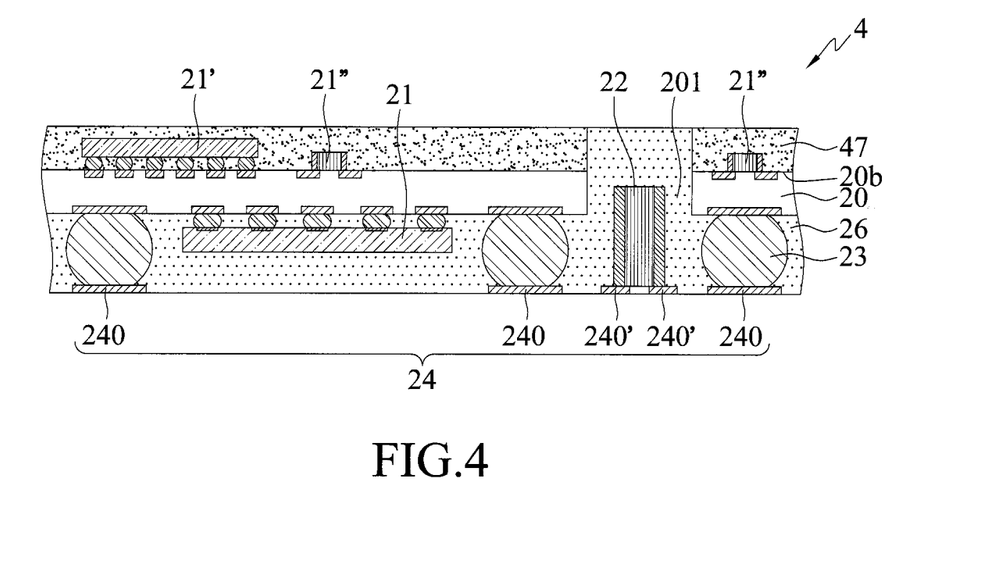
FIG. 4 is a schematic cross-sectional view of an electronic package structure according to a second embodiment of the present disclosure.

FIG. 4 is a schematic cross-sectional view of an electronic package structure 4 according to a second embodiment of the present disclosure.

Referring to FIG. 4, before the process of FIG. 2B is performed, a second encapsulant 47 is formed on the second side 20b of the first carrier 20 to encapsulate the first electronic components 21', 21''. The second encapsulant 47 is not filled in the opening 201. Then, the processes of FIGS. 2B to 2C are performed to obtain the electronic package structure 4.

In an embodiment, the second encapsulant 47 is made of polyimide, a dry film, an epoxy resin or a molding compound. The first encapsulant 26 and the second encapsulant 47 can be made of the same or different materials.

Through the above-described processes, the present disclosure further provides an electronic package structure 2, 4, which has: a first carrier 20 having at least an opening 201; a plurality of first electronic components 21, 21', 21'' and a plurality of conductive elements 23, 23', 23'' disposed on and electrically connected to the first carrier 20; a second carrier 24, 24' bonded to the conductive elements 23 so as to be electrically connected to the first carrier 20; at least a second electronic component 22 disposed on the second carrier 24, 24' and received in the opening 201; and a first encapsulant 26 formed on the first carrier 20 and the second carrier 24, 24' and encapsulating the first electronic component 21 (and the first electronic components 21', 21''), the second electronic component 22 and the conductive elements 23, 23', 23''.

In an embodiment, the opening 201 is positioned within an edge 20c of the first carrier 20.

In an embodiment, the opening 201 is positioned on a side of the first carrier 20.

In an embodiment, the opening 201 is positioned on a corner of the first carrier 20.

In an embodiment, at least one of the first electronic components 21, 21', 21'' and the second electronic component 22 is a package, an active component, a passive component, or a combination thereof.

In an embodiment, the conductive elements 23, 23', 23'' are solder balls, copper core balls, metal elements or circuit boards.

In an embodiment, at least one of the first carrier 20 and the second carrier 24, 24' is a circuit structure, a lead frame, a wafer, or a carrier board with a metal layout.

In an embodiment, the first electronic component 21 is positioned between the first carrier 20 and the second carrier 24.

In an embodiment, the second electronic component 22 is electrically connected to at least one of the first carrier 20 and the second carrier 24, 24'.

In an embodiment, the second electronic component 22 is electrically connected to the first carrier 20 through conductors 220.

In an embodiment, the second carrier 24' has at least a board 241 served as an EMI shield.

In an embodiment, the electronic package structure 4 further has a second encapsulant 47 encapsulating the first electronic components 21', 21''.

Therefore, by receiving the second electronic component such as a passive component in the opening of the first carrier, the present disclosure reduces the height of the electronic package structure so as to meet the miniaturization requirement.

Further, the second carrier provides an EMI shielding effect and improves the heat dissipating efficiency of the electronic package structure.

The above-described descriptions of the detailed embodiments are only to illustrate the implementation according to the present disclosure, and it is not to limit the scope of the present disclosure. Accordingly, all modifications and variations completed by those with ordinary skill in the art should fall within the scope of present disclosure defined by the appended claims

What is claimed is:
1. An electronic package structure, comprising:
  a first carrier having a first side, a second side opposite to the first side, and an opening that goes completely through the first carrier;
  at least a first electronic component disposed on and electrically connected to the first carrier;
  a plurality of conductive elements disposed on the first side of the first carrier and electrically connected to the first carrier, wherein the conductive elements include ring-shaped circuit boards or strip-shaped circuit boards electrically connected to the first carrier;

a second carrier bonded to the ring-shaped circuit boards or the strip-shaped circuit boards of the conductive elements and electrically connected to the first carrier via a solder material, wherein the second carrier is a lead frame;

at least a second electronic component received in the opening of the first carrier and disposed on the second carrier, wherein the second electronic component is free from protruding from the second side of the first carrier, and the second electronic component is electrically connected to the first carrier through a conductor of a bonding wire; and a first encapsulant formed on the second carrier and encapsulating the second electronic component and the conductive elements.

2. The electronic package structure of claim 1, wherein the first encapsulant is further formed on the first carrier and encapsulates the first electronic component.

3. The electronic package structure of claim 1, wherein the opening is positioned within an edge of the first carrier, on a side of the first carrier, or on a corner of the first carrier.

4. The electronic package structure of claim 1, wherein at least one of the first electronic component and the second electronic component is a package, an active component, or a passive component.

5. The electronic package structure of claim 1, wherein the conductive elements are solder balls, copper core balls, metal elements, circuit boards, or any combination thereof.

6. The electronic package structure of claim 1, wherein the first carrier is a circuit structure, a lead frame, a wafer, or a carrier board with a metal layout.

7. The electronic package structure of claim 1, wherein the first electronic component is positioned between the first carrier and the second carrier, and the second electronic component is electrically connected to at least one of the first carrier and the second carrier.

8. The electronic package structure of claim 1, wherein the lead frame has at least a board served as an electromagnetic interference (EMI) shield.

9. The electronic package structure of claim 1, further comprising a second encapsulant encapsulating the first electronic component.

* * * * *